United States Patent
Kirchdoerffer et al.

(10) Patent No.: US 7,411,385 B2
(45) Date of Patent: Aug. 12, 2008

(54) INDUCTIVE PRESENCE, PROXIMITY OR POSITION SENSOR

(75) Inventors: Remy Kirchdoerffer, Vufflens le Chateau (FR); Vladimir Frolov, Strasbourg (FR)

(73) Assignee: Senstronic (Societe Anonyme), Saverne (FR)

( * ) Notice: Subject to any disclaimer, the term of this patent is extended or adjusted under 35 U.S.C. 154(b) by 9 days.

(21) Appl. No.: 11/477,416

(22) Filed: Jun. 30, 2006

(65) Prior Publication Data
US 2007/0001667 A1 Jan. 4, 2007

(30) Foreign Application Priority Data
Jul. 1, 2005 (EP) .................................. 05360025

(51) Int. Cl.
*G01B 7/14* (2006.01)
(52) U.S. Cl. ............................. 324/207.15; 324/207.25
(58) Field of Classification Search ................................
324/207.12–207.25, 173–174
See application file for complete search history.

(56) References Cited

U.S. PATENT DOCUMENTS

| 5,563,511 | A | * | 10/1996 | Van Fleet, III | 324/174 |
| 5,581,179 | A | * | 12/1996 | Engel et al. | 324/207.2 |
| 5,998,988 | A | * | 12/1999 | Dickmeyer et al. | 324/174 |
| 6,054,850 | A | * | 4/2000 | Hayashi et al. | 324/174 |
| 6,882,143 | B2 | * | 4/2005 | Clymer et al. | 324/174 |
| 7,221,150 | B2 | * | 5/2007 | Hudson et al. | 324/207.15 |

FOREIGN PATENT DOCUMENTS

| DE | 33 46 340 | | 3/1985 |
| DE | 40 24 899 | | 2/1992 |
| DE | 92 10 564 | | 12/1993 |
| DE | 42 28 888 | A1 * | 3/1994 |

* cited by examiner

*Primary Examiner*—Jay M Patidar
(74) *Attorney, Agent, or Firm*—Young & Thompson

(57) ABSTRACT

An inductive presence, proximity or position sensor comprising an inductive coil defining a working or active face of the sensor corresponding to the external face of a covering plate or a substantially plane part of the housing or casing containing said coil, the plate or plane part being made of a metal with high mechanical resistance and being disposed substantially perpendicularly to the coil axis. The plate or plane part (4) has at least one linear discontinuity (6), extending at least partly across the plate or plane part (4).

20 Claims, 8 Drawing Sheets

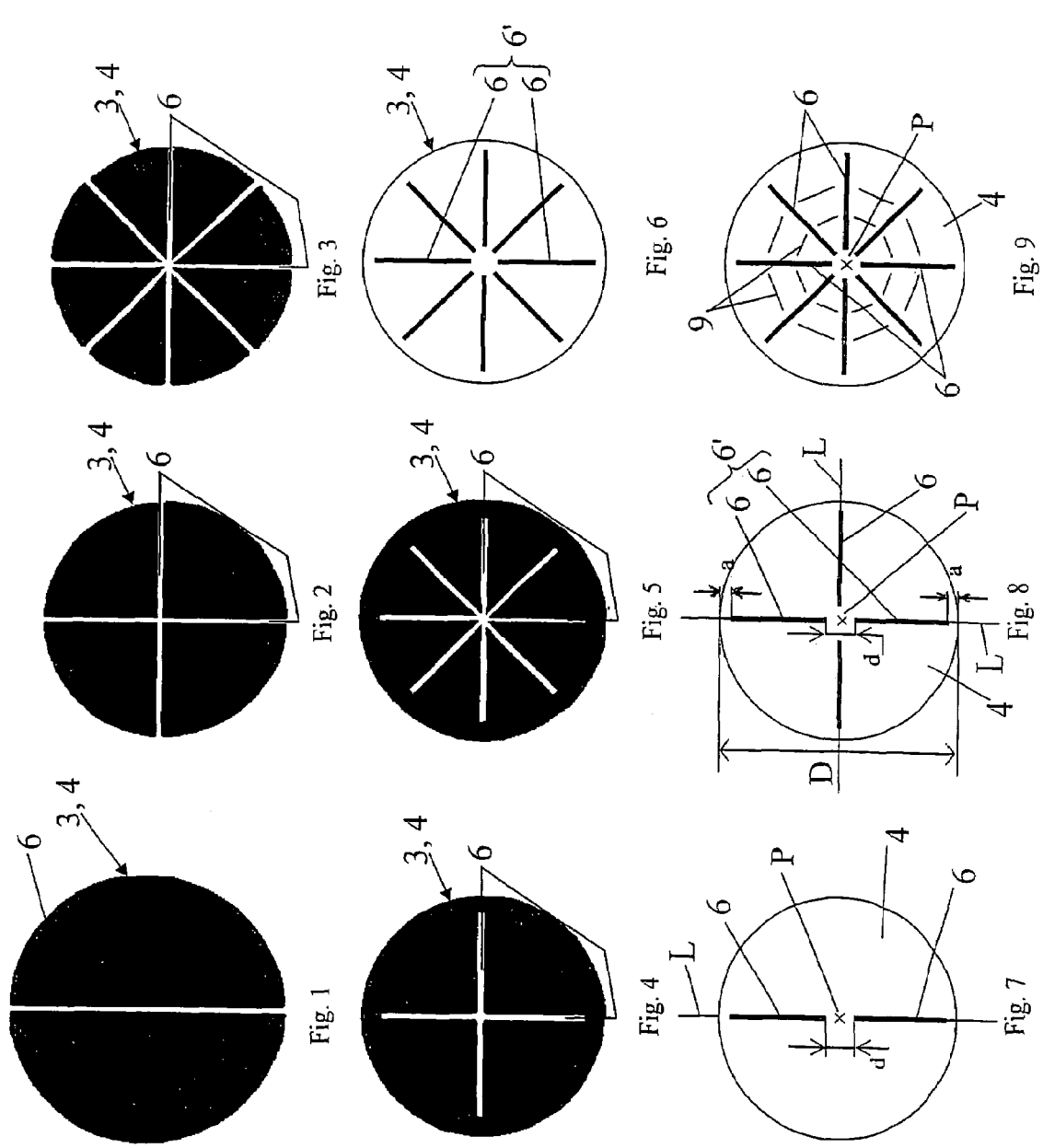

Target № 1  Target № 2  Target № 3

Target № 4  Target №6  Target № 7

Target № 8  Target № 9  Target № 10

INDUCTIVE PRESENCE, PROXIMITY OR POSITION SENSOR

The present invention concerns an inductive presence, proximity or position sensor which can be used for automation of industrial production, robotics, and for other industrial purposes.

The main function of such an inductive sensor is the detection without contact of the presence of a metallic target located at a certain distance from the working surface or face of the sensor.

The principle of operation of such inductive sensors consists in the fact that a LC-oscillatory circuit is used to generate a variable magnetic field with a frequency from several tens to several hundreds of kHz. The magnetic field of the sensor coil induces eddy currents in the metallic target. As a result the Q-factor of the LC-circuit changes depending on the distance between the metallic target and the working face of the sensor. The Q-factor variation increases as the distance between the target and the coil face surface decreases.

The change of the Q-factor of the oscillator circuit under the action of the target can be registered with the use of various schemes and technical methods, for example, by amplitude variation of damped oscillations of the LC-circuit as described in European patent application No. 05360003.7 of Jan. 26, 2005 in the name of the applicant.

In order to prevent shielding of the variable magnetic field by the material of the sensor head, into which the coil generating said magnetic field is placed, the head of the sensor is usually made of dielectric materials: e.g. plastic or ceramics. The main disadvantage of such sensors consists in a low mechanical strength and resistance which does not allow to ensure reliable mechanical damage protection of the sensor coil against impacts or to resist high pressure.

It has been proposed recently for the inductive sensors to be manufactured with working surfaces made of stainless steel with a typical thickness of 0.4 to 1.0 mm (steel face sensors). It is obvious, that such sensors have a higher mechanical strength and resistance as compared to standard ones with working faces made of plastics. At the same time the steel face sensors have an evident disadvantage as compared to standard sensors, namely, they show less sensitivity under otherwise equal conditions. This disadvantage results directly from the principle of operation of the steel face sensors, as it is shown below.

Actually, in order to reduce the attenuation of the variable magnetic field of the coil by the metallic working surface of the sensor (generally in the form of a plate or a plane part), it has been proposed that the thickness of said surface be made much less than that of the skin-layer.

The skin-layer thickness can be calculated from the following formula:

$$\alpha = \frac{C}{\sqrt{2\pi\mu\lambda\omega}} \quad (1)$$

where:

$\alpha$=thickness of the skin-layer, on which the variable magnetic field voltage is reduced by a factor of 2.73

C=velocity of light in vacuum, $\mu$=magnetic metallic permeability, $\lambda$=coefficient of electric metallic conductivity, $\omega$=angle frequency.

Theoretical estimations of the skin-layer thickness, performed with the use of formula (1) have shown that for frequencies of 10 KHz the skin-layer thickness is 0.6 mm for copper and 2 mm for stainless steel. Therefore, the optimum frequency for practical use of the steel face sensors must not exceed 15-30 KHz, which is 15 to 20 times less than the frequency in present standard sensors with plastic working surface.

It is known that the oscillator circuit Q-factor increases with the increase of resonance frequency, being described by formula (2):

$$Q = \frac{\overline{\omega}L}{r} \quad (2)$$

where: Q=circuit Q-factor, $\overline{\omega}$=resonance frequency, L=inductivity, r=active (ohmic) circuit resistance.

So, the sensitivity of the inductive sensor is proportional to oscillator circuit Q-factor. Therefore, the frequency restrictions, given by (1), put basical limits on sensitivity of sensors with metallic (stainless steel) working surfaces.

Practical experiments made by the inventors have shown that the Q-factor of sensors with plastic and metallic (stainless steel) working surface coincide in the field of low frequencies only (for M12 sensor less than 20 KHz). With the increase of the oscillations frequency, the oscillator circuit Q-factor, and also the sensitivity, are substantially higher for the sensor with a plastic working surface than for the sensor with a metallic working face, or placed in entire metallic housing made of stainless steel.

It is an aim of the present invention to overcome the aforementioned limitation. It is a further aim of this invention to optimise the performance of sensors with a metallic working face in the form of a metallic covering plate or of a plane part of an entirely metallic housing, without jeopardizing the mechanical resistance of these sensors, in particular in the region of the working face.

Therefore, the present invention concerns an inductive presence, proximity or position sensor comprising an inductive coil defining a working or active face of the sensor corresponding to the external face of a covering plate or a substantially plane part of the housing or casing containing said coil, said plate or plane part being made of a metal with high mechanical resistance and being disposed substantially perpendicularly to the coil axis, sensor characterised in that said plate or plane part comprises at least one cut or similar linear discontinuity, extending at least partly accross said plate or plane part.

Preferably, said at least one transversally extending cut is substantially centered with respect to the total surface area of the plate or plane part.

According to a first embodiment of the invention, the at least one cut extends through the entire thickness of the plate or plane part, thus forming a slot which is preferably filled in a tight manner with a dielectric material.

According to a second embodiment of the invention, the at least one cut extends only over a part of the thickness of the plate or plane part, leaving a layer of material which is uncut and continuous, said at least one cut being provided on the external or on the internal face of the plate or plane part, the cut(s) being preferably filled with a dielectric material.

Thus the present invention proposes a new approach for designing inductive sensors with a metallic working face, for example in an entirely metallic housing (steel face sensors). This approach consists in the fact that the metallic working face should not be in the form of a continuous metallic plate or plane part, but of a plate or plane part with thin cuts or slots, which prevent circulation of eddy currents induced by the variable magnetic field of the inductance coil of the sensor in said plate or plane part.

The physical base of the proposed approach was qualitatively described in "The Feynman lectures on physics"; Volume2; by Richard P. Feynman, Robert B. Leighton and Matthew Sands; Addison-Wesley Publishing Company, Inc. Reading, Mass., Palo Alto, London. 1964 with the help of metallic pendulum placed in permanent magnetic field. The effect consists in that the influence of eddy currents upon the metallic plate placed in the magnetic field is reduced greatly if slots are cut in the plate. But this prior art publication does not give any indication about how the cuts should be made, nor about their shape or dimension in relation to the shape or dimension of the magnetic field.

The invention will be better understood thanks to the following description and drawings of embodiments of said invention given as non limitative examples thereof, wherein in said drawings:

FIGS. 1 to 9 are front views of circular working faces of sensors with cylindrical housings, according to various embodiments of the invention (on FIGS. 1 to 5 the metallic material forming the plane part or plate is represented in black and the cuts or slots in white—it is the opposite on FIGS. 6 to 9);

Figure 14:
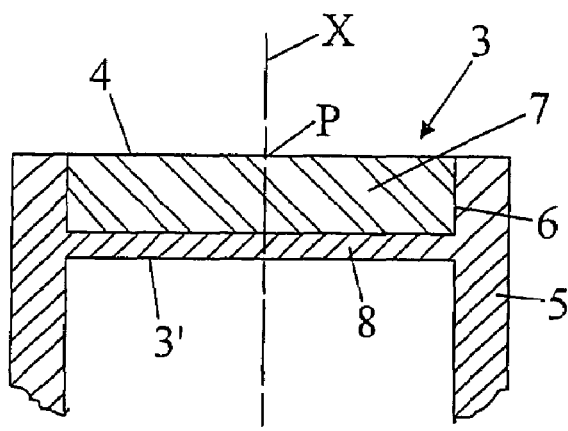
Figure 15:
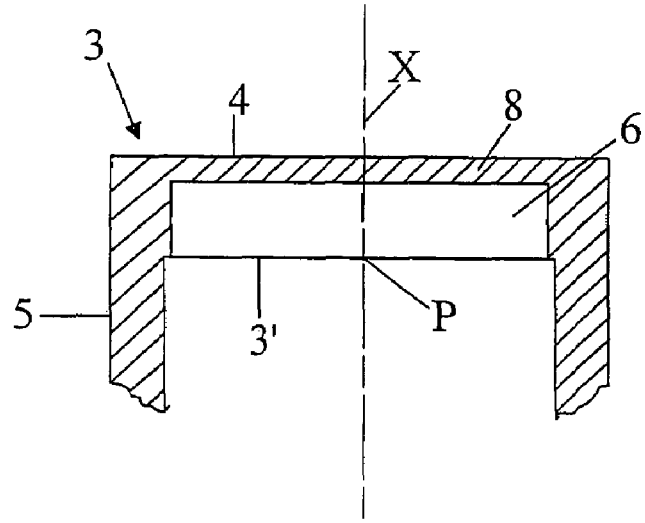
Figure 16:
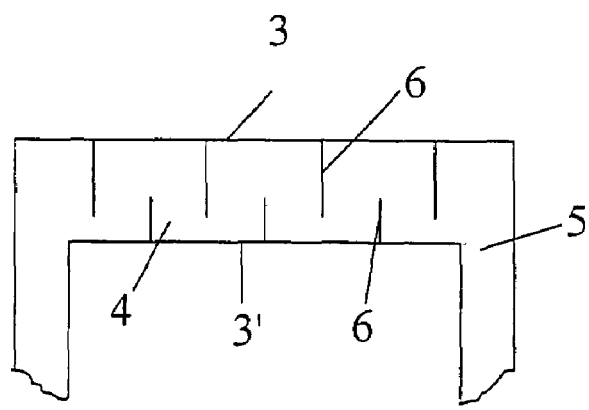

FIGS. 14 and 15 are cutaway views of the front parts of the housings of sensors according to the invention, showing respectively non going through cuts on the external (FIG. 14) and the internal (FIG. 15) sides of the front plane part of the housings of the sensors, and, FIG. 16 is a cutaway view of the front part of a housing of a sensor according to the invention, showing non going through, alternated internal and external cuts or slots on the front plane part.

Figure 17:
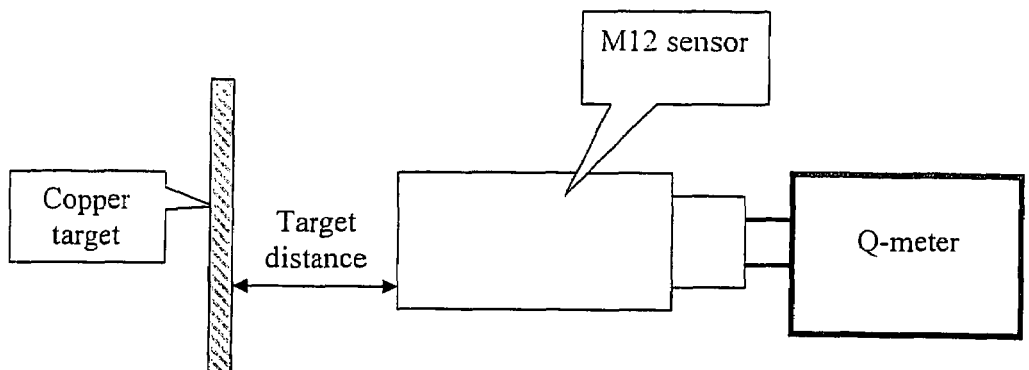

FIG. 17 is a M12 inductive sensor with a target.

Figure 18:
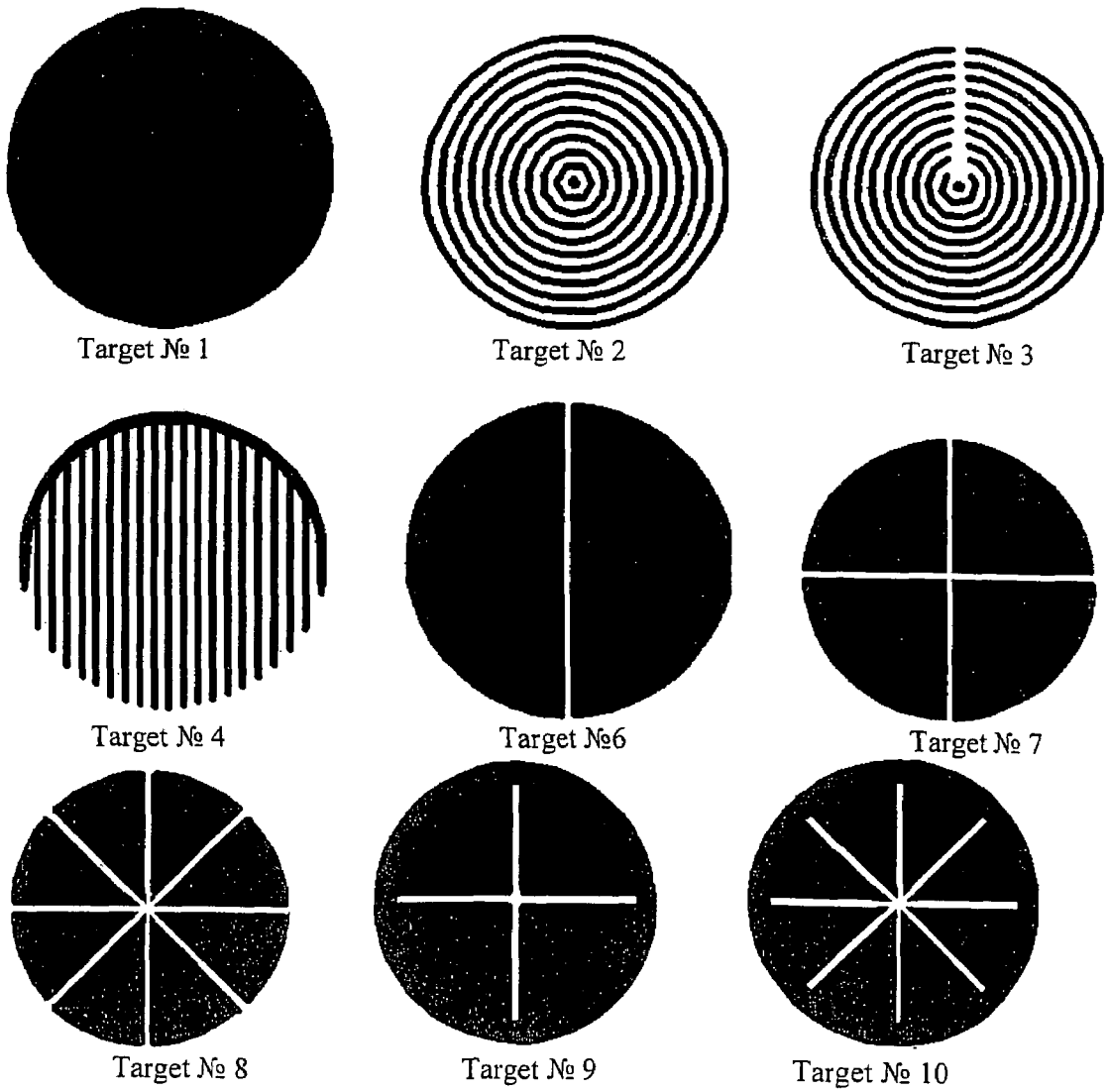

FIG. 18 is shapes of targets No. 1 to No. 10.

FIGS. 19 to 25 are experimental results on the charts for the sensor response and the target distance.

Figure 12:
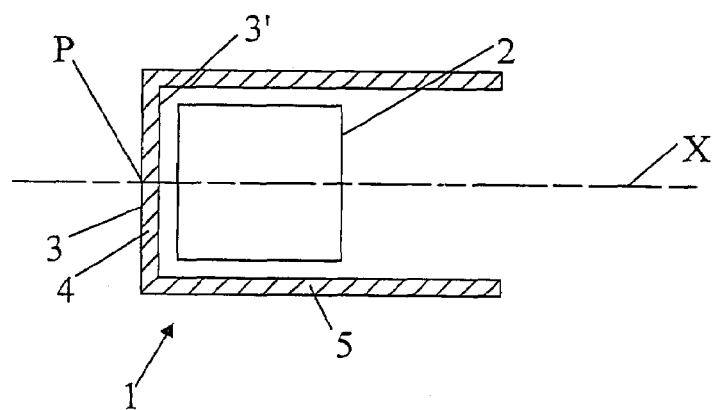
FIGS. 12 and 13 are cutaway views along a plane comprising the axis X of the coils of the sensors shown in FIGS. 1 to 11, with a working face respectively as a plane part of a unitary housing (FIG. 12) and as a separate plate fixed together with the housing (FIG. 13) (the slot(s) or cut(s) are not shown)
Figure 13:
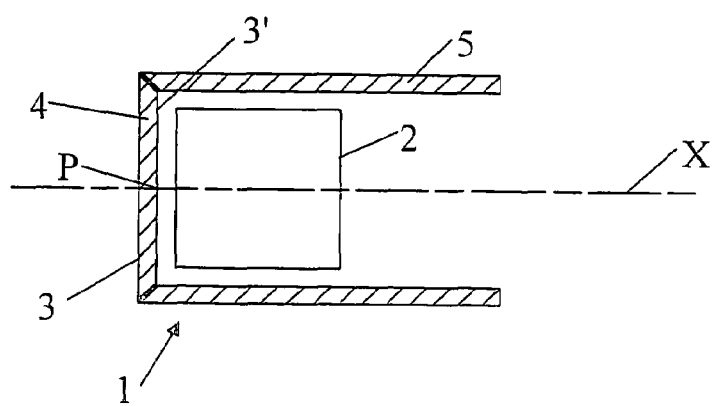

As shown on the previously mentioned figures, in particular on FIGS. 12 and 13, the sensor 1 mainly comprises an inductive coil 2 defining a working or active front face 3 of the sensor corresponding to the external face of a covering plate or a substantially plane part 4 of the housing or casing 5 containing said coil, said plate or plane part 4 being made of a metal with high mechanical resistance and being disposed substantially perpendicularly to the coil axis X.

As the person skilled in the art knows, the housing 5 of the sensor 1 can also enclose other components or filling materials, but they are without special relevance to the context of the present invention and are thus not represented, nor described.

According to the invention and as shown on FIGS. 1 to 11 and 14 to 16, the plate or plane part 4 comprises at least one cut or similar linear discontinuity 6, 6', extending at least partly accross said plate or plane part 4.

In the present specification, "linear discontinuity" means an absence of material defining a thin and elongate volume, with a given depth and with a straight or non straight shape.

Generally such discontinuities can be obtained by controlled laser cutting or similar precise cutting means. But they can also be obtained by mechanical cutting, chemical grinding or directly by moulding.

Furthermore, "metallic" means herein made of metal or of a metallic alloy, or possibly covered with metal or with a metallic alloy.

Experiences made by the inventors have shown (as described in more details later on) that the presence of one cut only is already sufficient to improve noticeably the performance of the sensor 1.

This is in particular the case when said at least one transversally extending cut 6, 6' is substantially centered with respect to the total surface area of the plate or plane part 4.

It is thus possible that the plate or plane part 4 comprises one single cut 6, 6', or alternatively that the plate or plane part 4 comprises at least two, preferably a plurality of cuts 6, 6', which provides an increased reduction of the eddy currents generated in the plate or plane part 4 forming the working face 3 by the magnetic field provided by the coil 2.

The choice of one of the two aforementioned alternate solutions depends, on one hand, on the requested mechanical resistance of the sensor 1 and, on the other hand, on the desired increase in performance of said sensor 1.

According to a first embodiment of the invention, and as shown for example on FIGS. 1 to 5, the at least one cut 6, 6' extends through the entire thickness of the plate or plane part 4, thus forming a slot which is preferably filled in a tight manner with a dielectric material 7.

According to a second embodiment of the invention, and as shown on FIGS. 14 and 15, the at least one cut 6, 6' extends only over a part of the thickness of the plate or plane part 4, leaving a layer 8 of material which is uncut and continuous, said at least one cut 6, 6' being provided on the external 3 or on the internal 3' face of the plate or plane part 4, the cut(s) 6 being preferably filled with a dielectric material 7.

Preferably, the thickness of the continuous uncut layer 8 of the plate or plane part 4 is smaller than the thickness of the skin layer for the used frequency.

According to an other embodiment of the invention, shown on FIG. 16, the plate or plane part 4 comprises at least one cut 6 provided on its external face 3 and at least one cut 6 provided on its internal face 3', each of said cuts 6 extending only over a part of the thickness of the plate or plane part 4 and cuts 6 on opposite faces being mutually non crossing.

In order to achieve an efficient reduction of the eddy currents generated by the action of the coil 2 in the plate or plane part 4, the at least one or each continuous or discontinuous cut 6, 6', situated on one of the two opposed faces 3 and 3' of the plate or plane part 4, is located on a straight line L going through the intersecting point P of the considered face 3 or 3' with the axis X of the coil 2 located in the casing or housing 5. Furthermore, said at least one cut 6, 6' has a length which corresponds to a substantial part of the length or dimension D of the plate or plane part 4 in the direction defined by said straight line L crossing transversally said plate or plane part 4.

Thus, the plane of each of said cuts or slots 6, 6' consists of a plane comprising or passing through the axis X of the coil 2.

Said intersecting point P is located centrally on the considered internal or external surface of the plate or plane part 4, as the coil itself is located in a centered manner within the housing 5.

As can be noticed from FIGS. 1 to 3, the cuts or slots 6 can extend radially up to the outer periphery of the plate or plane part 4.

Nevertheless, as illustrated by the FIGS. 4 to 11 and 15, the cuts or slots 6 do preferably not extend into the most outer annular area corresponding to the section of the lateral wall of the housing 5 (as seen from the working face), when the housing 5 of the sensor 1 is a one piece metallic housing having a plane part 4 defining the working face 3 (external surface of said part 4). The uncut area (forming a ring of width a around the periphery of the plane part 4) corresponds in width to the thickness of the lateral wall of the housing 5.

In order to maintain as much as possible the mechanical resistance and strength of the sensor and simultaneously to increase noticeably the performance of said sensor, by reducing the interfering action of the plate or plane part 4, the invention proposes that the latter comprises at least two cuts 6, supported in pairs by the same straight line L going through the intersecting point P of the considered face 3 or 3' of the plate or plane part 4 with the axis X of the coil 2 and located mutually symmetrically with respect to said intersecting point P, thus forming at least one discontinuous cut 6' made of two segments 6 supported by the same straight line L and separated by a given distance d in the region of the said intersecting point P (FIGS. 6 to 9 and 11).

So, by maintaining the central region of the plane part or plate 4 uncut, a bridging material area is maintained between the sectors formed by the interrupted or discontinuous cuts, which allows to preserve substantially the structural integrity of said plate or plane part 4. The diameter of the uncut central part is about $1/5$ to $1/15$, preferably around $1/10$, of the transversal dimension of the front working face 3, in dependence of the particular shape of the coil or of its possibly associated ferrite.

Each segment 6 of each discontinuous cut 6' extends continuously from the border of the plate or plane part 4 (possibly leaving an outer area uncut—see uncut areas of width a on FIG. 8) to the central uncut region, which extends around the intersecting point P.

As shown on FIGS. 6, 8, 9 and 11, the cuts 6, 6' can be advantageously located on different straight lines L passing all through the intersecting point P and arranged around said point P, preferably in a substantially even circumferential angular arrangement.

Figure 10:
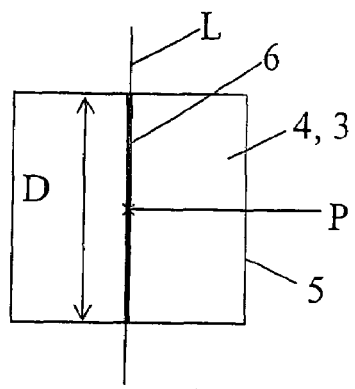
FIGS. 10 and 11 are front views of square working faces of sensors with parallelepipedic housings according to other embodiments of the invention.
Figure 11:
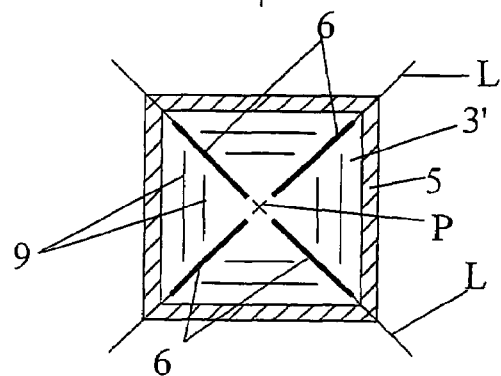

Additionally, the plate or plane part 4 may also comprise secondary cuts 9 extending between the cuts considered as primary cuts 6, without connection with the latters and arranged around the intersecting point P in one or several concentric layers located at various distances from said point P (FIGS. 9 and 11).

These secondary cuts 9 may reduce the smaller eddy current loops in the plate or plane part 4.

The inventors have conducted several experiments in order to validate the principle of the invention and to optimise the configuration of the slots and cuts in the metallic working face 3 of the sensor 1 formed by the plate or plane part 4. They will now be described and explained with reference to FIGS. 17 to 25.

These first series of experiments were conducted using a so-called M12 inductive sensor (sensor with a cylindrical outerly threaded casing with a diameter of 12 mm).

First, the inventors studied the dependence of the target "visibility" from the target topology, taking into account that the geometry of the worst target will be the best for the sensible plane (working face) geometry.

This approach allowed to simplify the experimentation, which was realised with a M12 inductive sensor with a brass case and a plastic working face, using a rigidly mounted coil in a ferrite cup.

More precisely, the inductance coil parameters are the following: number of turns: 200, diameter of the copper wire of the coil: 0.08 mm. The coil was placed in a ferrite cup B 65933-A-X22 (Epcos AG) with an outer diameter of 7.35 mm and 3.6 mm in height. Measurements of the Q-factor were done with the use of the Q-factor meter E7-20.

The experimental assembly is shown on FIG. 17. The coil Q-factor was measured (oscillation frequency of 50 KHz) for various distances between the sensor working face and the plane of the target.

Instead of standard steel targets, corresponding to the international norms IEC 60947-5-2, the inventors used copper targets of the same sizes with various topology of the metallic surface. The shapes of said targets No. 1 to No. 10 are shown on FIG. 18.

The targets were manufactured according to the lithography method of foiled hardened paper and consist of thin discs of 12 mm diameter with slots of various configurations. The thickness of the copper foil is 0.06 mm ($\alpha \sim 0.25$ mm), the width of the slots in the metal is 0.4 mm.

In a first series of experiments the targets No. 1 to 4 were tested. The experiment results of this serie are rendered in FIG. 19.

In order to be able to discuss the obtained results, it appears advisable to define a so-called <<target surface coefficient>>. Under this term we shall understand the ratio of the slots area in the metallic target relative by the full target area. It is clear that for target 1 its value is equal to zero, and that for the targets No. 2 to 4 it is approximately the same and equal to ~0.5.

Figure 19:
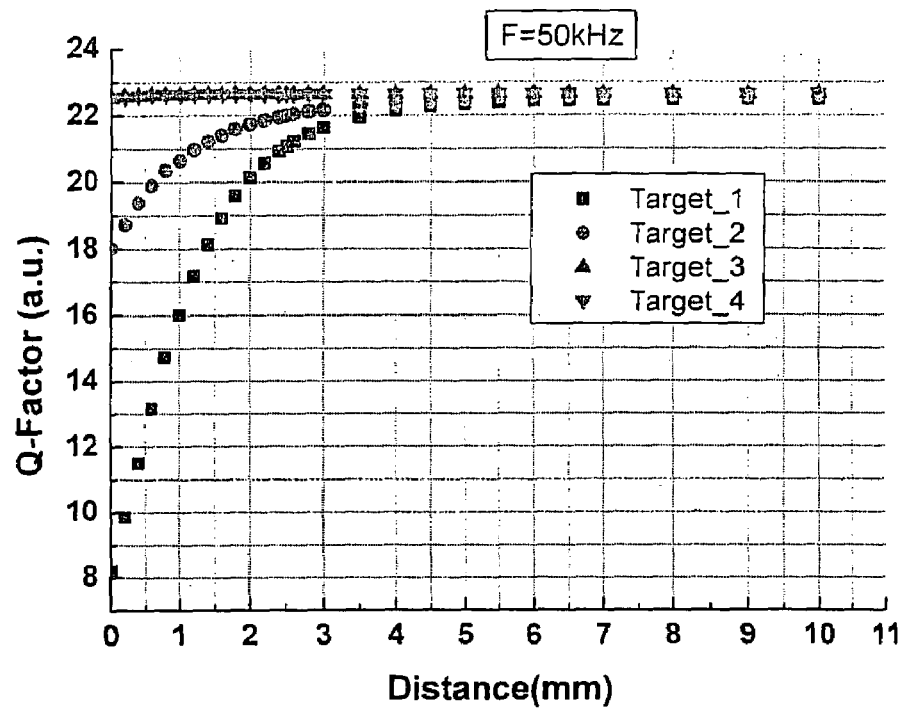

As it follows from FIG. 19, the sensor response (variation of Q-factor versus distance to the target) for targets with practically the same target surface coefficient greatly depends on the target topology, i.e. on the configuration of the slots on the targets. When the metallic portions of the target do not form closed circuits, the sensor sensitivity to the target is practically absent. This, in its turn, means that the use of such multilinked topology as the metallic working face of a sensor, instead of a plastic face, should not lead to a substantial drop of the sensitivity of the sensor towards conventional targets.

The difference in the results related to targets No. 1 and 2 can be explained by the sole difference in the target surface coefficients: the area of metallic coating of target 1 is in size twice that of target 2, their topology being the same for the axially symmetric current loops. This also confirms the logical assumption made by the inventors that, in an axially symmetric magnetic field, the eddy currents form axially symmetric loops (relatively to the axis X of the coil generating the magnetic field).

For practical use, it is of interest to discuss the question of the sensitivity of the sensor towards multilinked metallic targets, when the target surface coefficient does not exceed the value of 0.05 to 0.15. It is obvious that, in case of minimal target surface coefficient (working plane), its mechanical properties should approach the mechanical properties of the continuous or solid working surface. As it is seen from FIG. 18, the 0.05 to 0.15 surface coefficient corresponds to targets No. 6 to 8. The results of the tests for these targets are given in FIG. 20.

One can see, that one simple cut in the solid metallic target can be sufficient to change the sensor sensitivity to the target by several times. The figure shows that with further increase in number of the working face cuts, the metallic target properties approache asymptotically that of dielectric in their effect upon the inductive sensor.

Figure 21:
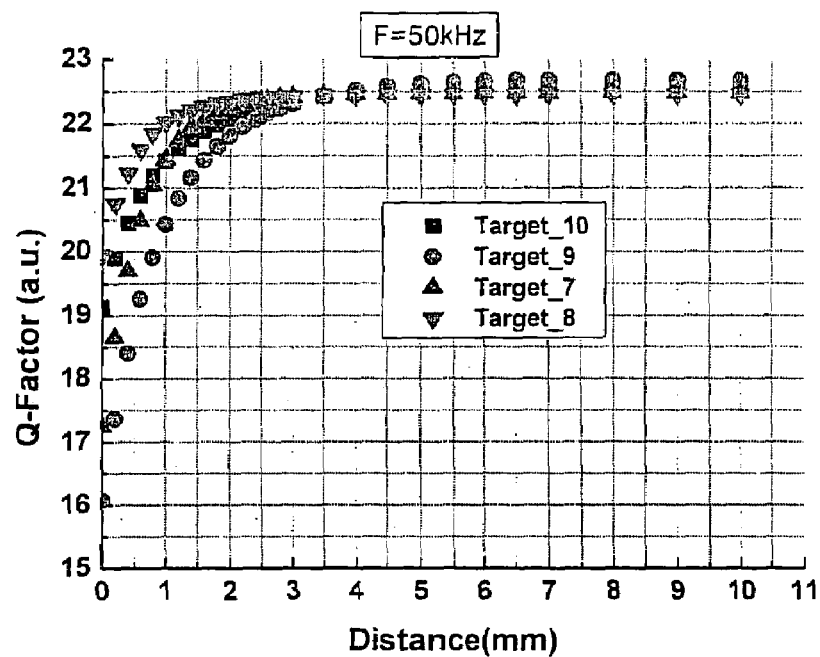
Figure 22:
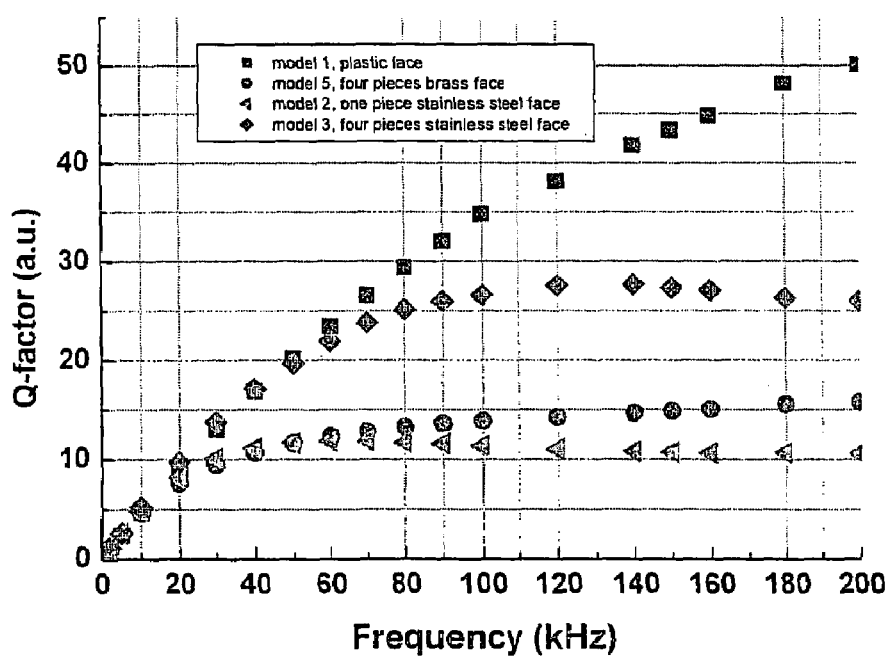

The results given in FIG. 21 illustrate the effect of closed metallic ring (uncut annular area) along the perimeter of the cut target upon the sensor sensitivity.

The peripheral conductive ring slightly increases the sensor sensitivity to the target. At the same time, a general tendency is maintained, consisting in the fact that the increase in number of the cuts in the metallic surface leads to reduction of the target—inductance coil interaction, as it was mentioned above this leads to the contrary effect for the working face of the sensor.

Figure 20:
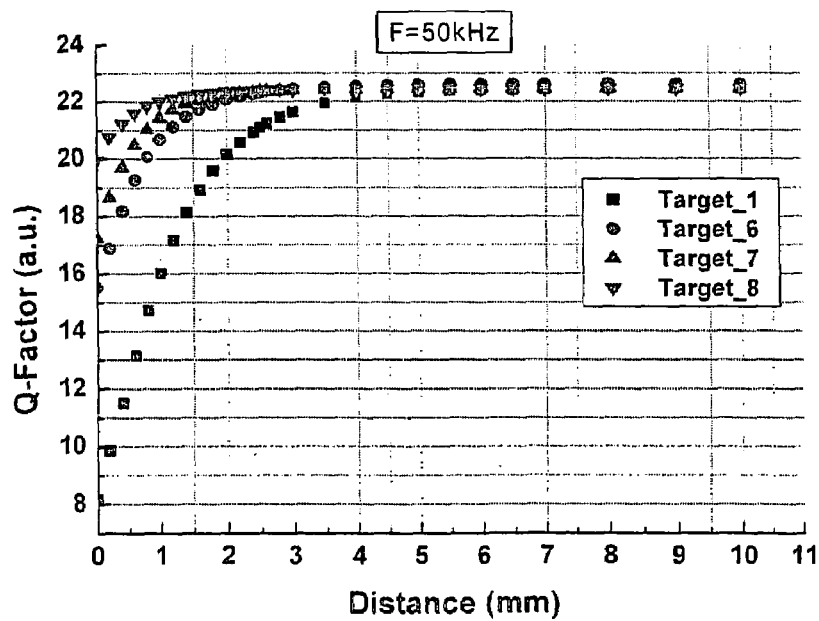

To confirm the advantages of the proposed invention in practice and to optimise them, the results illustrated in FIG. 19 to 21 were used in several direct experiments.

At first, the inventors compared sensor models with cut metallic working faces (same topology as for targets number 9 and 10 of FIG. 18), with a plain plastic working face, as well as with a continuous entirely metallic working face (without cut). Their main parameters are given in Table 1 hereunder.

TABLE 1

|  | model 1 | model 2 | model 3 | model 4 | model 5 |
|---|---|---|---|---|---|
| Sensor housing materials | brass | stainless steel | stainless steel | stainless steel | brass |
| Sensor face materials | plastic | stainless steel | stainless steel | stainless steel | brass |
| Sensor face thickness, mm | 0.5 | 1 | 1 | 1 | 1 |
| Face topology | one piece | one piece | four pieces or sectors | eight pieces or sectors | four pieces or sectors |
| Number of coil turns | 200 | 200 | 200 | 200 | 200 |

For the models 3 and 4 with a stainless steel working face, the slots of 0.2 mm width were made with the help of a laser cutting technology. In case of model 5, with a brass working face, the slots were made in a mechanical way.

The first series of experiments, confirming the possibility of achieving the aim of the proposed invention, consisted in taking measurements of the frequency dependency of the Q-factor of the same oscillatory circuit, placed in various housings. The resulting data are shown by the charts on FIG. 22.

The cuts in the metallic working face 3, 4 of the sensor 1 lead to substantial increase (more than twice) in the Q-factor in comparison with an entire metallic (non-cut or continuous) working face. It is necessary to underline that this effect is not a consequence of any geometrical factor as the working face surface coefficient in the case of the cut faces does not exceed 0.05, i.e. it is practically equal to that of entire or uncut metallic face.

Another interesting result is the fact that the Q-factor of the sensor with a non-cut stainless steel working surface (model 2) and the one of the sensor with the cut brass surface (model 5) are close in value, although electric conductivity of brass is considerably higher than that of stainless steel. Thus it is also possible to produce sensors with housings made from well conducting materials.

The second series of experiments (done with the same models) included Q-factor measurement as a function of the distance between the working face of the sensor and the surface of the standard steel square target of 12×12×1 mm. They were conducted at two fixed frequencies of 50 kHz and 80 kHz. As a measurement unit of the sensor sensitivity, the inventors used the differential Q-factor value ΔQ, calculated relatively to the value of the Q-factor in the absence of the target:

$$\Delta Q = Q(x) - Q(\infty) \quad (3)$$

$Q(x)$=circuit Q-factor when the standard target is at a distance xmm from the sensor, $Q(\infty)$=circuit Q-factor in the absence of target.

Figure 23:
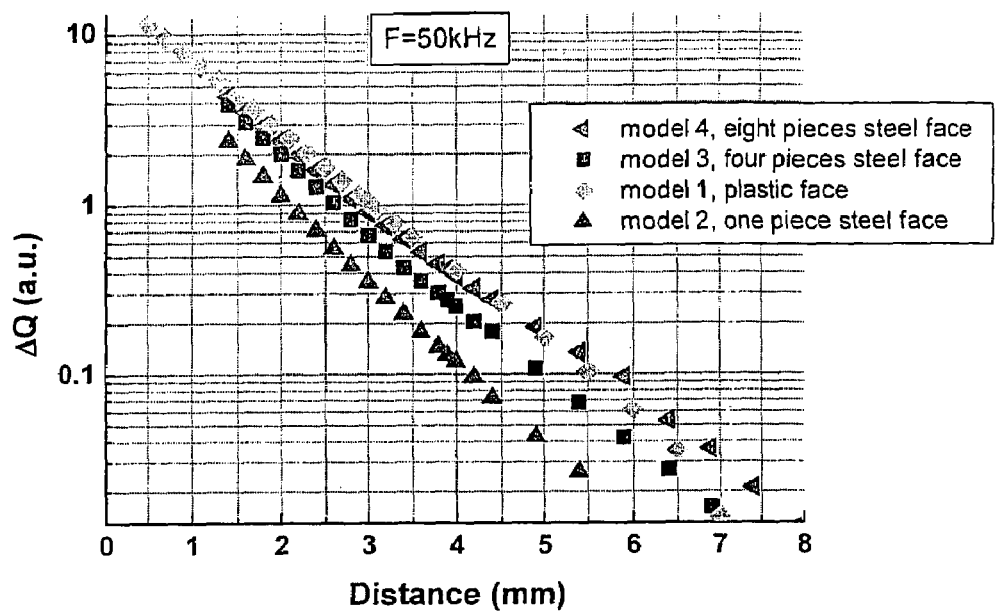
Figure 24:
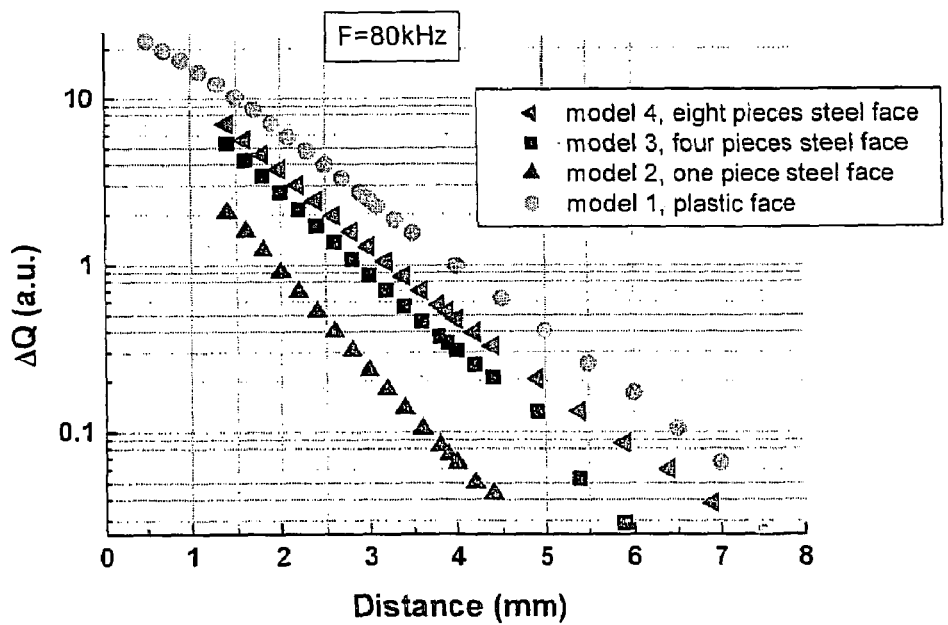

The results of these experimental measurements are shown on the charts of FIGS. 23 (oscillator circuit frequency of 50 kHz) and 24 (oscillator circuit frequency of 80 kHz).

The inductive presence or position sensors concerned by the invention are relay type sensors, i.e. they operate or trigger when a signal induced by a metallic target exceeds the set value of the adjusted threshold voltage of the sensor. Therefore, to compare operation ranges of various sensors, it is necessary to determine their respective operation threshold, eventually determined by the electronics used for signal treatment. For further discussion herein one should take as a threshold value ΔQ=0.1.

Applying it to FIG. 23 results in an operation distance of 4 mm for a sensor with a working face of entire stainless steel piece (model 2), and 5.5 mm for a sensor with plastic face (model 1). Cuts or slots in the metallic working surface (models 3, 4) lead to increase of the operation distance of the sensor as compared to the non-cut metallic working surface. In case of an oscillation frequency of 80 kHz, the sensor operation distance is 3.5 mm for non-cut stainless steel working face (model 2), but increases from 5.2 to 5.6 mm for the working face provided with cuts or slots (models 4 and 5—FIG. 24).

The above tests on examples of embodiments of the invention prove that thin cuts or slots in the metallic working face of the sensor lead to a substantial increase (more than 1.5) in its operation distance.

Another series of experiments, allowed to optimise the mechanical properties of the sensor by choosing particular forms for the cuts or slots.

The used assembly was the same as in FIG. 17 with the differences that the diameter of the sensor was 30 mm and that the target was a steel square plate (1 mm thick) of 60×60 mm in size.

The plane parts of the housings forming the working faces of the compared sensor models were made of 1 mm thick stainless steel and had the following configuration or topology of cuts or slots:

model 6: same cuts as in FIG. 8 (with: d=3 mm, D=30 mm and a=2 mm),
model 7: same cuts as in FIG. 6 (with: d=3 mm, D=30 mm and a=2 mm),
model 8: same cuts as in FIG. 4 (with D=30 mm and a=2 mm),
model 9: same cuts as in FIG. 5 (with D=30 mm and a=2 mm),
model 10: no cut.

The parameters of the inductance coil of the sensors were the following: number of turns=260, diameter of the coil copper wire=0.2 mm. The coil was placed in a ferrite cup B65939-A-X22 EPCOS with an outer diameter of 24.5 mm and 8.8 mm in height. Measurements of the Q-factor were done with the use of a Q-factor meter E7-20. The coil Q-factor was measured (oscillation frequency of 10 kHz) for various distances between the sensor face and plane of the target.

Figure 25:
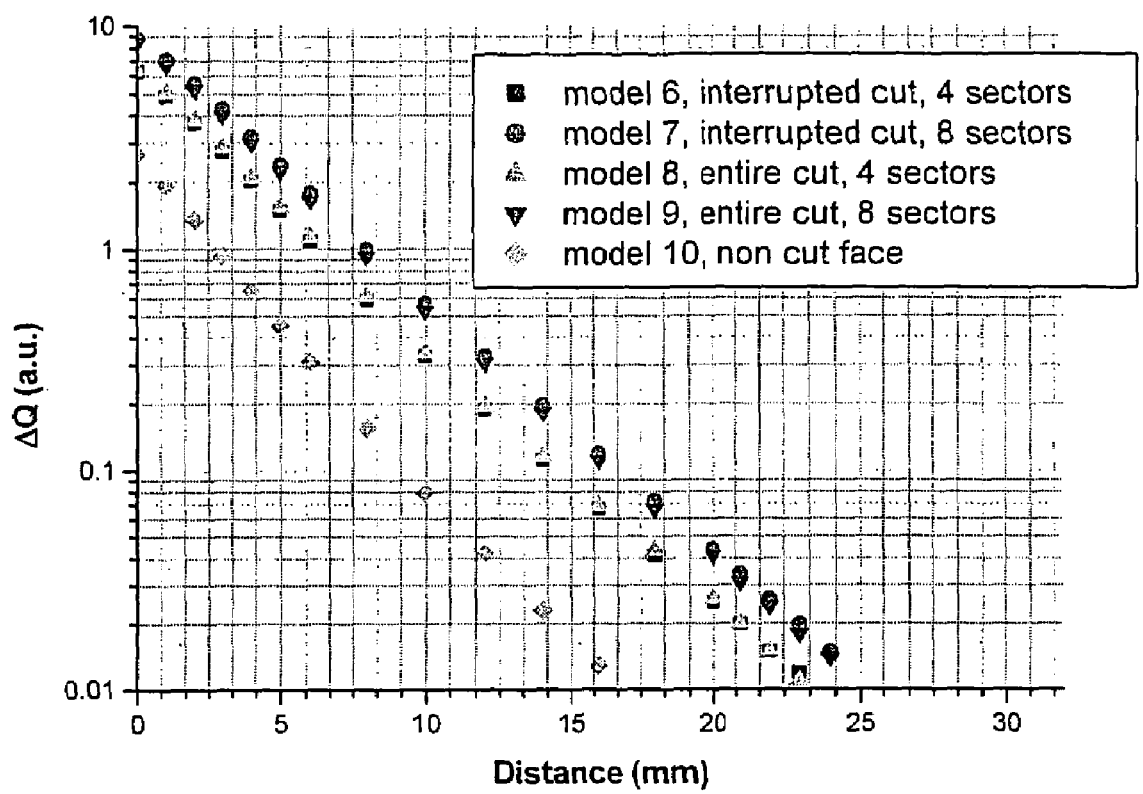

The results of the measurements are given in FIG. 25:

As for the previous M12 sensor, the cutting of the metallic face leads to evident increase of the working distance. On the same time, another very important conclusion can be made:

sensors with interrupted cuts (models 6, 7) are equal in terms of inventive properties to that with entire cut (models 8, 9). This acknowledgement leads to an important advantage in view of the mechanical solidity of the sensor. It was also noticed that further increase of the central non cut zone up to 8 mm results in a 20% decrease of coil signal.

In accordance with the invention, and depending on the ratio [increase of sensing performance/mechanical strength and resistance of the sensor housing], the ratio (surface coefficient as defined before) of the apparent surface of the cut(s) 6 to the total surface of the plate or plane part 4 is comprised within 0.001 and 0.9.

Within a first alternate embodiment, it can be proposed that the surface ratio of the cut(s) 6 to the plate or plane part is comprised between 0.01 and 0.10, preferably around 0.05.

Within a second alternate embodiment, it can be proposed that the surface ratio of the cut(s) 6 to the plate or plane part 4 is comprised between 0.05 and 0.20, preferably around 0.10.

Although any possible shape might be contemplated (see for example FIGS. 10 and 11), the plate or plane part 4 has preferably a circular disc shape.

Furthermore, the plane part 4 preferably consists of an unitary end closing wall of a cylindrical housing or casing 5 with circular section, the outer face of said housing or casing 5 being preferably provided with a threading.

The described technique of providing cuts or slots in the metallic working face gives considerable rise of the working distance of the concerned inductive sensor. There exists the possibility to leave the central zone uncut, without essential drop of sensor functionality and performance.

The present invention is, of course, not limited to the preferred embodiments described and represented herein, changes can be made or equivalents used without departing from the scope of the invention.

The invention of claimed is:

1. Inductive presence, proximity or position sensor comprising an inductive coil defining a working or active face of the sensor corresponding to the external face of a covering plate or a substantially plane part of a housing or casing containing said coil, said plate or plane part being made of a metal with high mechanical resistance and being disposed substantially perpendicularly to the coil axis,
   sensor (1) characterised in that said plate or plane part (4) comprises at least one linear discontinuity (6, 6'), extending at least partly across said plate or plane part (4).

2. Inductive sensor according to claim 1, characterised in that said at least one linear discontinuity (6, 6') is substantially centered with respect to the total surface area of the plate or plane part (4).

3. Inductive sensor according to claim 2, characterised in that the at least one linear discontinuity (6, 6') extends through the entire thickness of the plate or plane part (4), thus forming a slot.

4. Inductive sensor according to claim 2, characterised in that the at least one linear discontinuity (6, 6') extends only over a part of the thickness of the plate or plane part (4), leaving a layer (8) of material which is uncut and continuous, said at least one linear discontinuity (6, 6') being provided on the external (3) or on the internal (3') face of the plate or plane part (4).

5. Inductive sensor according to claim 2, characterised in that the at least one linear discontinuity (6, 6'), situated on one of the two opposed faces (3 and 3') of the plate or plane part (4), is located on a straight line (L) going through the intersecting point (P) of the considered face (3 or 3') with the axis (X) of the coil (2) located in the casing or housing (5) and in that said at least one linear discontinuity (6, 6') has a length which corresponds to a substantial part of the length or dimension (D) of the plate or plane part (4) in the direction defined by said straight line (L) crossing transversely said plate or plane part (4).

6. Inductive sensor according to claim 2, characterised in that the at least one linear discontinuity (6, 6'), situated on one of the two opposed faces (3 and 3') of the plate or plane part (4), is located on a straight line (L) going through an intersecting point (P) of a considered face (3 or 3') with the axis (X) of the coil (2) located in the casing or housing (5) and in that said at least one linear discontinuity (6, 6') has a length which corresponds to a substantial part of the length or dimension (D) of the plate or plane part (4) in the direction defined by said straight line (L) crossing transversely said plate or plane part (4).

7. Inductive sensor according to claim 1, characterised in that the at least one linear discontinuity (6, 6') extends through the entire thickness of the plate or plane part (4), thus forming a slot.

8. Inductive sensor according to claim 1, characterised in that the at least one linear discontinuity (6, 6') extends only over a part of the thickness of the plate or plane part (4), leaving a layer (8) of material which is uncut and continuous, said at least one cut (6, 6') being provided on the external (3) or on the internal (3') face of the plate or plane part (4).

9. Inductive sensor according to claim 1, characterised in that the at least one linear discontinuity (6, 6'), situated on one of the two opposed faces (3 and 3') of the plate or plane part (4), is located on a straight line (L) going through an intersecting point (P) of a considered face (3 or 3') with the axis (X) of the coil (2) located in the casing or housing (5) and in that said at least one linear discontinuity (6, 6') has a length which corresponds to a substantial part of the length or dimension (D) of the plate or plane part (4) in the direction defined by said straight line (L) crossing transversely said plate or plane part (4).

10. Inductive sensor according to claim 5, characterised in that the plate or plane part (4) comprises at least two linear discontinuities (6), supported in pairs by the same straight line (L) going through the intersecting point (P) of the considered face (3 or 3') of the plate or plane part (4) with the axis (X) of the coil (2) and located mutually symmetrically with respect to said intersecting point (P), thus forming at least one discontinuous linear discontinuity (6') made of two segments (6) supported by the same straight line (L) and separated by a given distance (d) in the region of the said intersecting point (P).

11. Inductive sensor according to claim 1, characterised in that the plate or plane part (4) comprises one linear discontinuity (6, 6').

12. Inductive sensor according to claim 1, characterised in that the plate or plane part (4) comprises at least two linear discontinuities (6, 6').

13. Inductive sensor according to claim 12, characterised in that the linear discontinuities (6, 6') are located on different straight lines (L) passing all through the intersecting point (P) and arranged around said point (P), in a substantially even circumferential angular arrangement.

14. Inductive sensor according to claim 13, characterised in that the plate or plane part (4) comprises also secondary linear discontinuities (9) extending between the linear discontinuities (6) considered as primary linear discontinuities, without connection with the latter and arranged around the intersecting point (P) in one or several concentric layers located at various distances from said point (P).

15. Inductive sensor according to claim 1, characterised in that the ratio of the apparent surface of the linear discontinuity (s) (6) to the total surface of the plate or plane part (4) is comprised within 0.001 and 0.9.

16. Inductive sensor according to claim 15, characterised in that the surface ratio of the linear discontinuity(s) (6) to the plate or plane part is comprised between 0.01 and 0.10.

17. Inductive sensor according to claim 15, characterised in that the surface ratio of the linear discontinuity(s) (6) to the plate or plane part (4) is comprised between 0.05 and 0.20.

18. Inductive sensor according to claim 1, characterised in that the plate or plane part (4) has a circular disc shape.

19. Inductive sensor according to claim 1, characterised in that the plane part (4) consists of a unitary end closing wall of a cylindrical housing or casing (5) with circular section.

20. Inductive sensor according to claim 1, characterised in that the plate or plane part (4) is made of special steel.

* * * * *